(12) United States Patent
Itaka et al.

(10) Patent No.: US 7,882,476 B2
(45) Date of Patent: Feb. 1, 2011

(54) SEMICONDUCTOR INTEGRATED CIRCUIT DEVICE FORMED BY AUTOMATIC LAYOUT WIRING BY USE OF STANDARD CELLS AND DESIGN METHOD OF FIXING ITS WELL POTENTIAL

(75) Inventors: Yasuhito Itaka, Yokohama (JP); Koichi Kinoshita, Yokohama (JP); Takeshi Sugahara, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 613 days.

(21) Appl. No.: 11/886,928

(22) PCT Filed: Sep. 15, 2005

(86) PCT No.: PCT/JP2005/017425

§ 371 (c)(1),
(2), (4) Date: Dec. 6, 2007

(87) PCT Pub. No.: WO2006/100795

PCT Pub. Date: Sep. 28, 2006

(65) Prior Publication Data

US 2009/0083686 A1    Mar. 26, 2009

(30) Foreign Application Priority Data

Mar. 24, 2005    (JP) ............................. 2005-086340

(51) Int. Cl.
*G06F 17/50*    (2006.01)
*H01L 27/118*    (2006.01)
*H01L 27/092*    (2006.01)

(52) U.S. Cl. .............................. 716/10; 716/2; 257/202; 257/371

(58) Field of Classification Search .................. 716/2, 716/10; 257/202, 371
See application file for complete search history.

(56) References Cited

U.S. PATENT DOCUMENTS 5,901,065 A    5/1999    Guruswamy et al.

(Continued)

FOREIGN PATENT DOCUMENTS

JP    2000-332118 A    11/2000

(Continued)

OTHER PUBLICATIONS

International Search Report, PCT/JP2005/017425 published under WO 2006/100795A1, Sep. 6, 2006.

(Continued)

*Primary Examiner*—Stacy A Whitmore
(74) *Attorney, Agent, or Firm*—Sprinkle IP Law Group

(57) ABSTRACT

Standard cells without a well potential fixing active region (4T-11 to 4T-14, 4T-21 to 4T-24, 4T-31 to 4T-34, 4T-41 to 4T-44) are read from a library and a circuit is temporarily designed by automatic layout wiring. Then, a change in the substrate potential is estimated from at least one of the number of transistors to be switched at the same timing in the temporarily designed circuit, the sizes of transistors, the transition probability, and the appearance probability. It is determined whether the estimated change in the substrate potential is within a reference value. If the estimated change in the substrate potential has exceeded the reference value, standard cells with a well potential fixing active region (2T-11, 2T-21, 2T-31 and 2T-41) are read from the library and placed in a region where the estimated change in the substrate potential exceeds the reference value. Thereafter, automatic layout wiring is done again, thereby forming a circuit.

20 Claims, 9 Drawing Sheets

U.S. PATENT DOCUMENTS

| | | | |
|---|---|---|---|
| 5,984,510 A * | 11/1999 | Guruswamy et al. | ........... 716/2 |
| 6,380,593 B1 | 4/2002 | Maxey et al. | |
| 2001/0010090 A1 | 7/2001 | Boyle et al. | |
| 2005/0001271 A1 | 1/2005 | Kobayashi | |

FOREIGN PATENT DOCUMENTS

| | | |
|---|---|---|
| JP | 2003-133416 | 5/2003 |

OTHER PUBLICATIONS

Written Opinion of the International Searching Authority, European Patent Office, PCT/JP2005/017425, Sep. 6, 2006.

Guruswamy et al., "Cellerity: A Fully Automatic Layout Synthesis System for Standard Cell Libraries", Proceedings of the Design Automation Conference, Anaheim, Jun. 9-13, 1997, New York, ACM, US, vol. CONF. 34, pp. 327-332, XP010227603 ISBN: 0-7803-4093-0, Jun. 9, 1997.

Ciesielski et al., "Analytical Approach to Layout Generation of Datapath Cells", IEEE Transactions on Computer Aided Design of Integrated Circuits and Systems, vol. 21, No. 12, XP011070661 ISSN: 0278-0070, Dec. 2002.

* cited by examiner

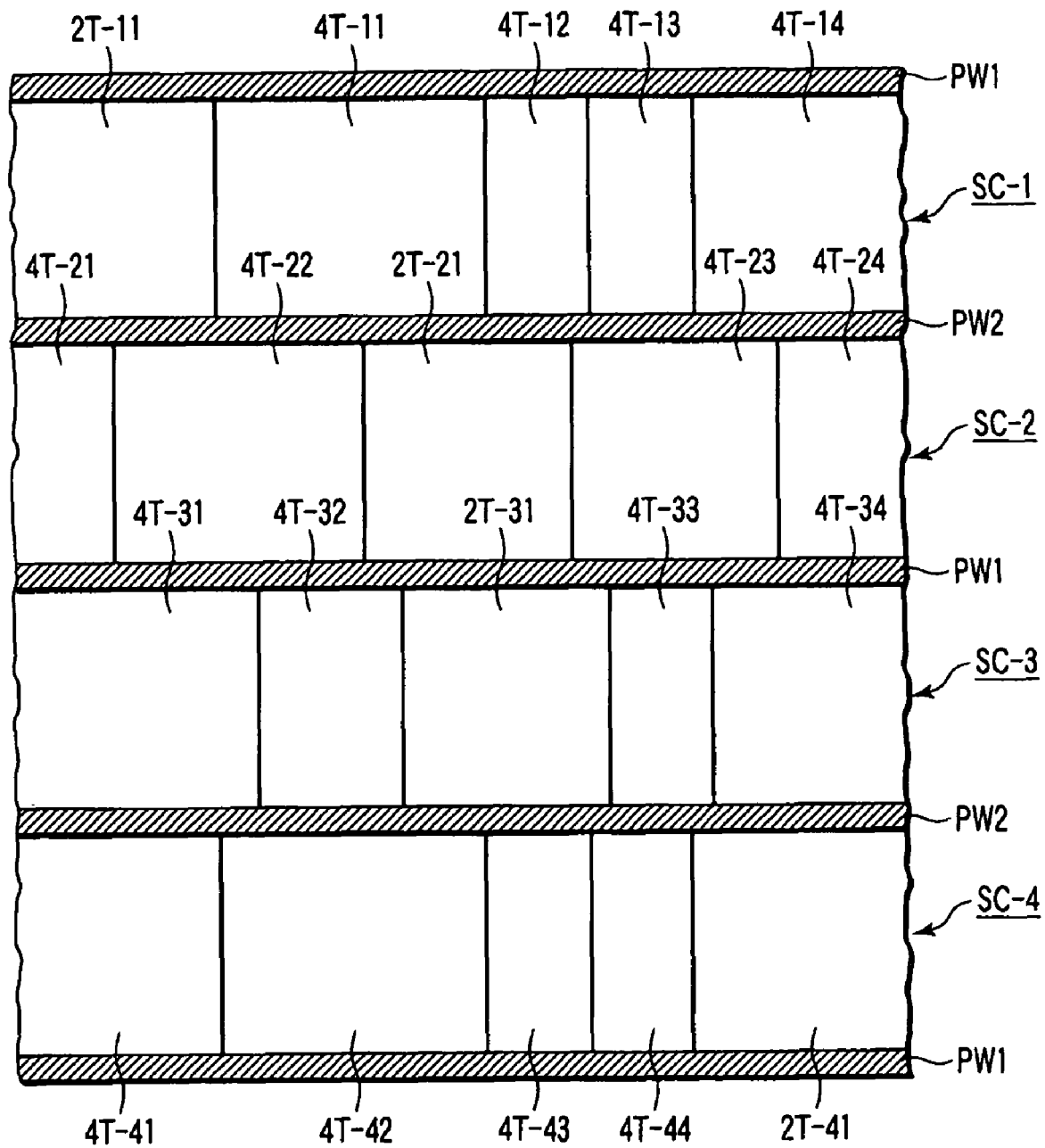
F I G. 1

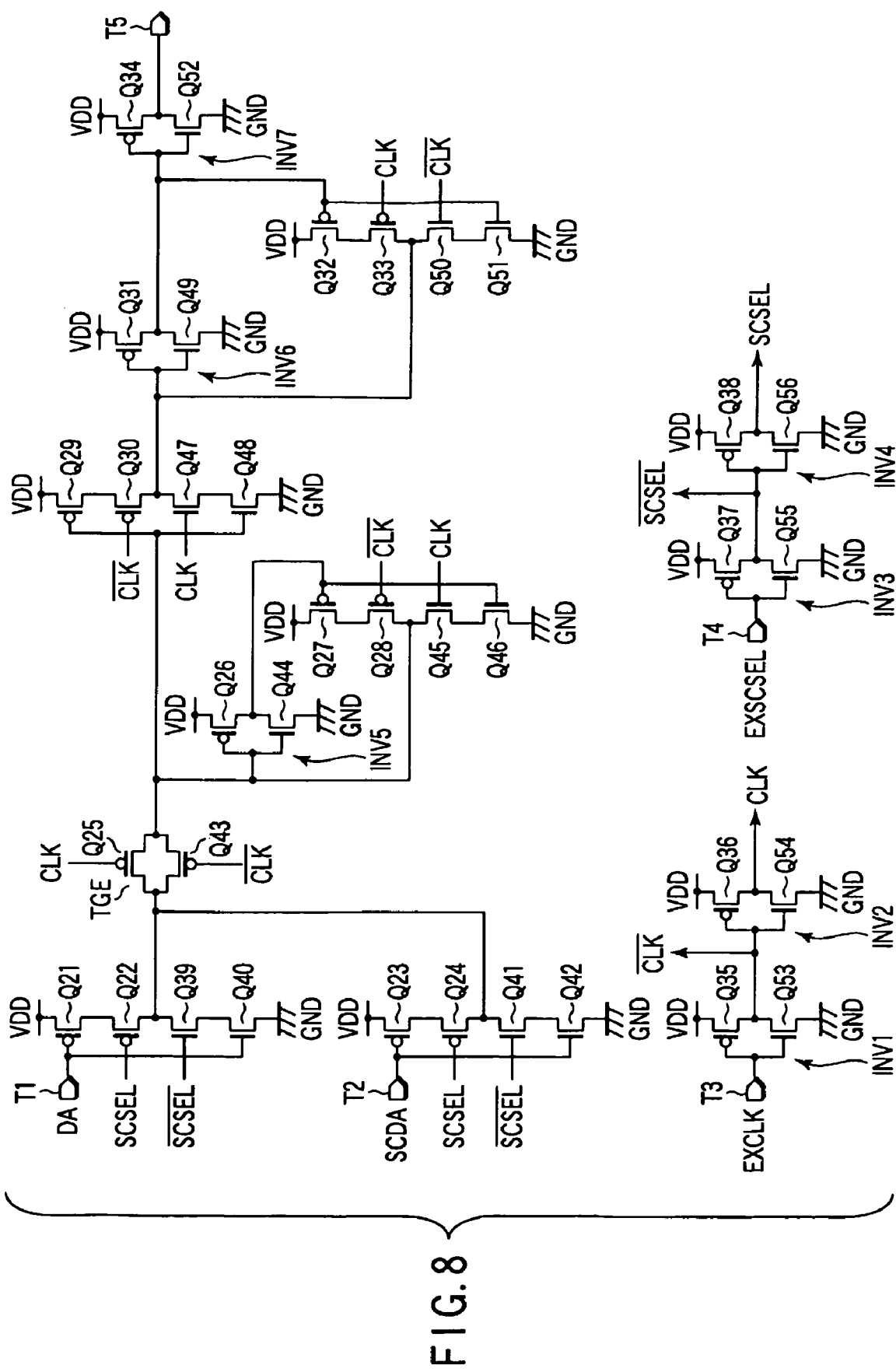
F I G. 8

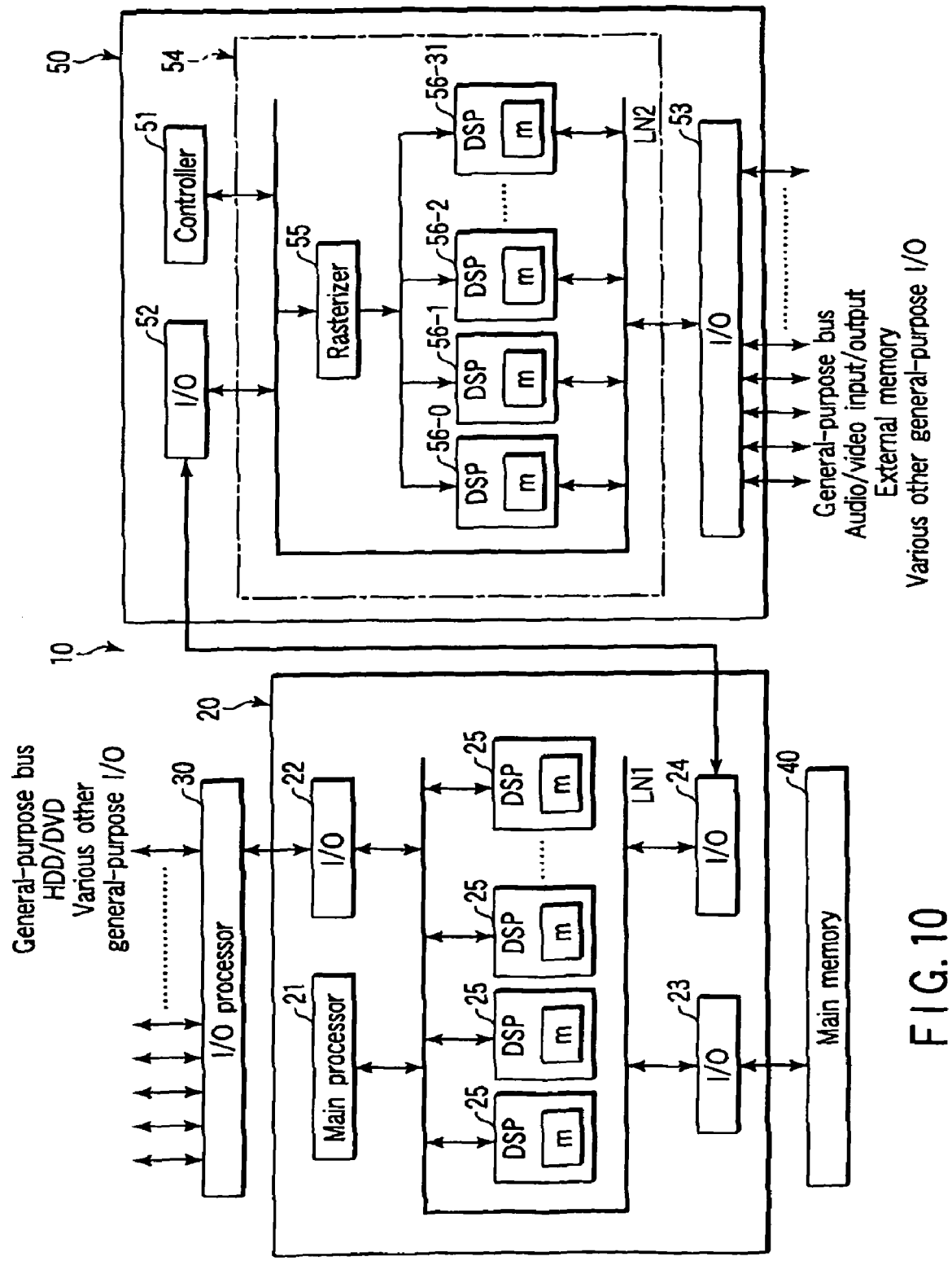
F I G. 10

SEMICONDUCTOR INTEGRATED CIRCUIT DEVICE FORMED BY AUTOMATIC LAYOUT WIRING BY USE OF STANDARD CELLS AND DESIGN METHOD OF FIXING ITS WELL POTENTIAL

CROSS-REFERENCE TO RELATED APPLICATIONS

This application is a U.S. national phase application under 35 USC 371 of International Application No. PCT/JP2005/017425 (not published in English), filed Sep. 15, 2005 which is based upon and claims the benefit of priority from prior Japanese Patent Application No. 2005-086340, filed Mar. 24, 2005, the entire contents of which are incorporated herein by reference.

TECHNICAL FIELD

This invention relates to a semiconductor integrated circuit device and related design method, and more particularly to the technique for fixing the well potential in a semiconductor integrated circuit device formed by automatic layout wiring by use of standard cells.

BACKGROUND ART

It is known that the element characteristics of the transistors formed in a semiconductor integrated circuit device, such as an IC and an LSI, are influenced by fluctuations in the well potential. To avoid such influence and stabilize the element characteristics of the transistors, it is necessary to stabilize (fix) the well potential.

In a semiconductor integrated circuit device formed by automatic layout wiring by use of standard cells, each of the standard cells is provided with a power supply voltage terminal and a ground potential terminal. To fix the well potential, active regions called a P-sub region and an N-sub region are formed in the p-well region and n-well region, respectively. The p-well region is connected via the P-sub region to the ground potential terminal, thereby fixing the p-well region to the ground potential GND. The n-well region is connected via the N-sub region to the power supply voltage terminal, thereby fixing the n-well region to the power supply voltage VDD.

In the standard cells, a power line for the power supply voltage VDD and a power line for the ground potential GND are provided to two sides facing each other and extending in the direction in which the cells are arranged. In the semiconductor substrate under these power lines, the p-well region and the n-well region are formed. In these well regions, semiconductor elements, including transistors, are formed so as to configure various circuits. In the p-well region and n-well region, the well potential fixing P-sub region and N-sub region are formed, respectively. The power line for the power supply voltage is electrically connected via a contact hole to the N-sub region and the power line for the ground potential is electrically connected via a contact hole to the P-sub region, thereby fixing the well potential.

To make use of the substrate bias effect of a MOS transistor positively, a standard cell may be used which has four terminals for the power supply voltage, ground potential, P-sub region, and N-sub region (for example, refer to Japanese Patent Application KOKAI Publication No. 2000-332118). The 4-terminal standard cell applies via independent lines the power supply voltage VDD, the ground potential GND, the potential VBN for fixing the n-well potential, and the potential VBP for fixing the p-well potential. In the 4-terminal standard cell, a line for applying the potential VBP for fixing the p-well potential and a line for applying the potential VBN for fixing the n-well potential are provided to two sides facing each other and extending in the direction in which the cells are arranged. In the semiconductor substrate under these lines, the N-sub region and P-sub region are formed. The line for fixing the potential in the p-well region is electrically connected via a contact hole to the P-sub region and the line for fixing the potential in the n-well region is electrically connected via a contact hole to the N-sub region. Inside the lines, a power line for the power supply voltage VDD and a power line for the ground potential GND are arranged. The n-well region and p-well region are formed in the semiconductor substrate between the power lines. In the n-well region and p-well region, semiconductor elements, including transistors, are formed so as to configure various circuits.

With the above configuration, however, the P-sub region and N-sub region for fixing the well potential and their interconnections lead to an increase in the cell area. To prevent the cell area from increasing, the sizes of semiconductor elements, including transistors, formed in the cell have to be reduced, resulting in a decrease in the driving capability. Particularly when the sub-regions and their interconnections are formed with the minimum line width according to design rules, the minimum distance or the like for the MOS transistors formed in the well region is limited or the step coating property is degraded. From these points of view, the cell area increases or the sizes of transistors must be reduced. In addition, contact with the densely arranged sub-regions is difficult in manufacturing processes. If there are many such patterns, manufacturing yield drops.

With the miniaturization of semiconductor integrated circuit devices, the power supply voltage is getting lower and therefore the substrate current is getting smaller. Therefore, in a semiconductor integrated circuit device with a reduced power supply voltage, there is a possibility that the well potential will be fixed efficiently by minimizing a decrease in the driving capability due to an increase in the cell area or to a reduction in the transistor size. This is because, when the power supply voltage comes closer to 1 V, as much potential difference as allows a forward current to flow through the p-n junction does not appear. Since not only the substrate current decreases due to the reduced power supply voltage, but also the source potential of the transistor is normally fixed, when the power supply voltage is about 1 V, a fluctuation in the well potential caused by the coupling with the drain is less than 0.5 V, half the power supply voltage. Therefore, there is almost no possibility that a breakdown will take place due to latch-up.

Of course, when the substrate potential fluctuates at random, the driving capability of the transistor and the leakage current fluctuate according to the fluctuation of the potential. Therefore, to take measures against the fluctuations, the well potential has to be fixed.

DISCLOSURE OF INVENTION

According to an aspect of the present invention, there is provided a semiconductor integrated circuit device comprising a circuit section which is formed by arranging cell columns, each having standard cells arranged in a first direction, in a second direction crossing the first direction, the cell columns including, first standard cells each of which has a first and a second terminal to which a power supply voltage and the ground potential are applied and a first circuit which includes a transistor that operates on the voltage applied between the first and second terminals and has no well potential fixing active region, and second standard cells which are arranged in a region where transistors to be switched at the same timing in the first standard cells are concentrated or near a large transistor and each of which includes a third and a fourth terminal to which the power supply voltage and the ground potential are applied and a second circuit which includes a first and a second active region for fixing a well potential formed in an empty region inside and electrically connected to the third and fourth terminals respectively and a transistor to which power is supplied from the third and fourth terminals and a back gate bias is applied from the first and second active regions, the well potential of the first standard cells in the cell columns being fixed by the second standard cells.

According to another aspect of the present invention, there is provided a semiconductor integrated circuit device comprising a circuit section which is formed by arranging cell columns, each having standard cells arranged in a first direction, in a second direction crossing the first direction, the cell columns including, first standard cells each of which has a first and a second terminal to which a power supply voltage and the ground potential are applied and a first circuit which includes a switch element that operates on the voltage applied between the first and second terminals and has no well potential fixing active region, and second standard cells which are arranged in the vicinity of a region where the transition probability is high in the first standard cells and each of which includes a third and a fourth terminal to which the power supply voltage and the ground potential are applied and a second circuit which includes a first and a second active region for fixing a well potential formed in an empty region inside and electrically connected to the third and fourth terminals respectively and a transistor to which power is supplied from the third and fourth terminals and a back gate bias is applied from the first and second active regions, the well potential of the first standard cells in the cell columns being fixed by the second standard cells.

According to still another aspect of the present invention, there is provided a semiconductor integrated circuit device comprising a circuit section which is formed by arranging cell columns, each having standard cells arranged in a first direction, in a second direction crossing the first direction, the cell columns including, first standard cells each of which has a first and a second terminal to which a power supply voltage and the ground potential are applied and a first circuit which operates on the voltage applied between the first and second terminals and has no well potential fixing active region, and second standard cells which are arranged in the vicinity of a region where first standard cells with a high probability are concentrated and each of which includes a third and a fourth terminal to which the power supply voltage and the ground potential are applied and a second circuit which includes a first and a second active region for fixing a well potential formed in an empty region inside and electrically connected to the third and fourth terminals respectively and a transistor to which power is supplied from the third and fourth terminals and a back gate bias is applied from the first and second active regions, the well potential of the first standard cells in the cell columns being fixed by the second standard cells.

According to still another aspect of the present invention, there is provided a semiconductor integrated circuit device designing method comprising reading a first group of standard cells without a well potential fixing active region from a library and temporarily designing a circuit by automatic layout wiring, estimating a change in the substrate potential from at least one of the number of transistors to be switched at the same timing in the temporarily designed circuit, the sizes of transistors to be switched simultaneously, the transition probability, and the appearance probability, determining whether the estimated change in the substrate potential is within a reference value, and if the estimated change in the substrate potential has exceeded the reference value, reading a second group of standard cells with a well potential fixing active region from the library, placing the second group of standard cells in a region where the estimated change in the substrate potential in the first group of standard cells exceeds the reference value, and forming a circuit by automatic layout wiring.

BRIEF DESCRIPTION OF DRAWINGS

FIG. 1 is a schematic plan view of a part of the cell columns in a semiconductor integrated circuit device according to a first embodiment of the present invention which is formed by automatic layout wiring by use of standard cells;

FIG. 8 is a circuit diagram of a typical example of a cell with high transition probability, particularly a flip-flop in a sequential circuit;

FIG. 10 is a block diagram of an image drawing processor system LSI to help explain an application of the semiconductor integrated circuit device and its design method according to the first to third embodiments.

BEST MODE FOR CARRYING OUT THE INVENTION

First Embodiment

Figure 2:
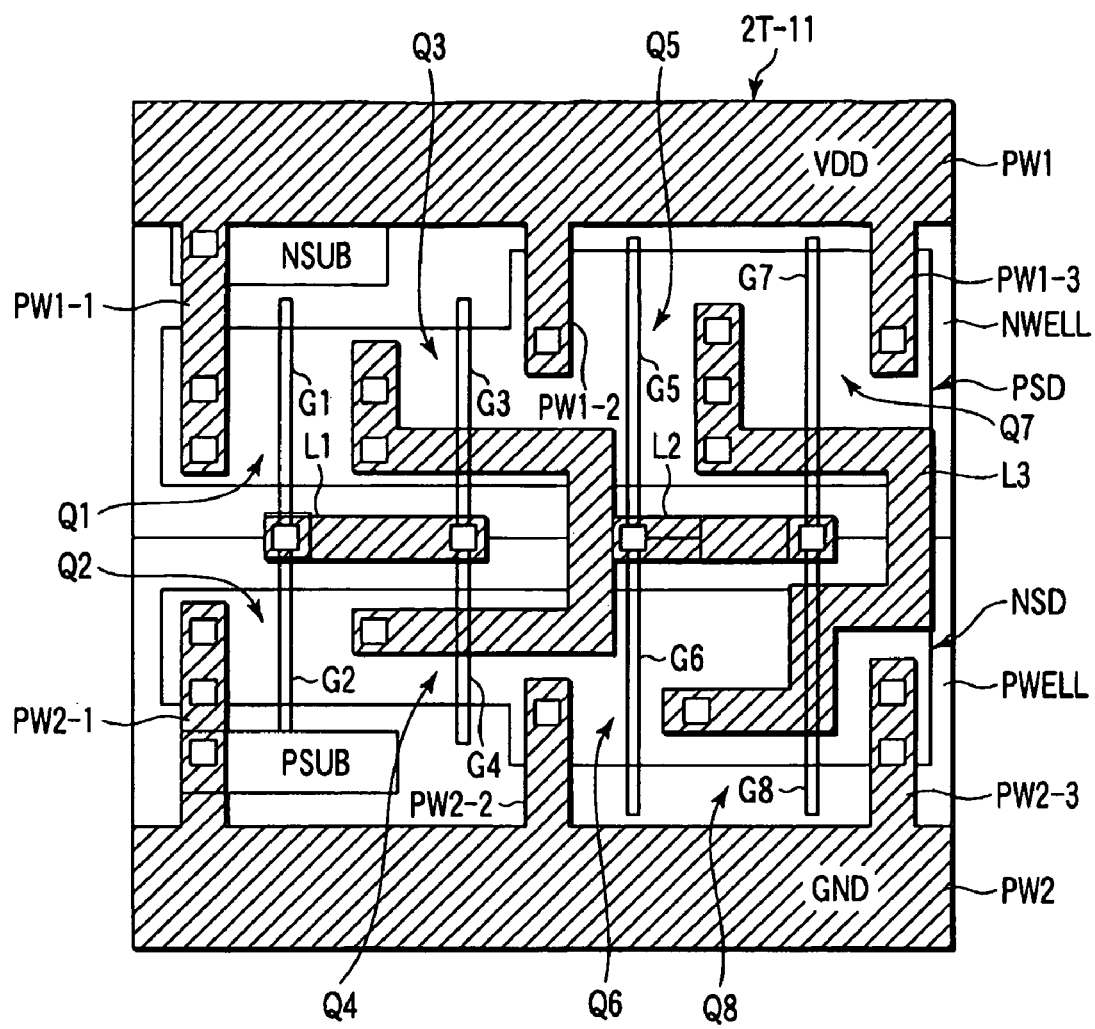
FIG. 2 is a plan view of a pattern layout of a 2-terminal standard cell in the semiconductor integrated circuit device of FIG. 1.
Figure 3:
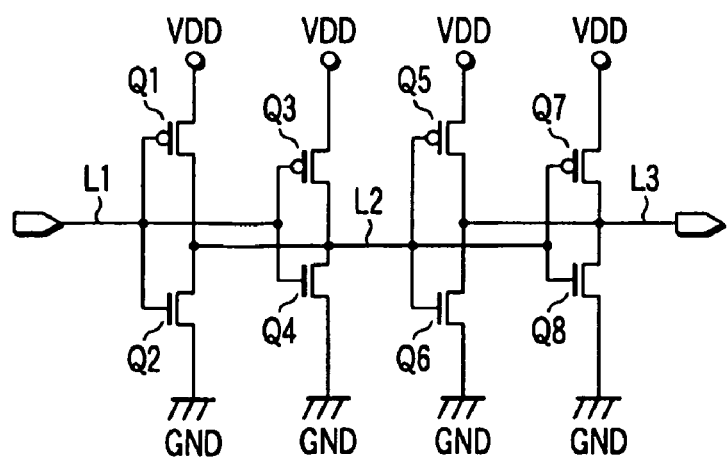
FIG. 3 is a circuit diagram of the standard cell shown in FIG. 2, particularly a CMOS buffer.

FIGS. 1 to 5 are for explaining a semiconductor integrated circuit device according to a first embodiment of the present invention. FIG. 1 schematically shows a part of the cell columns in the semiconductor integrated circuit device formed by automatic layout wiring by use of standard cells. FIG. 2 shows a pattern layout of a 2-terminal standard cell in the semiconductor integrated circuit device of FIG. 1. FIG. 3 is a circuit diagram of the standard cell shown in FIG. 2, particularly a CMOS buffer.

Figure 4:
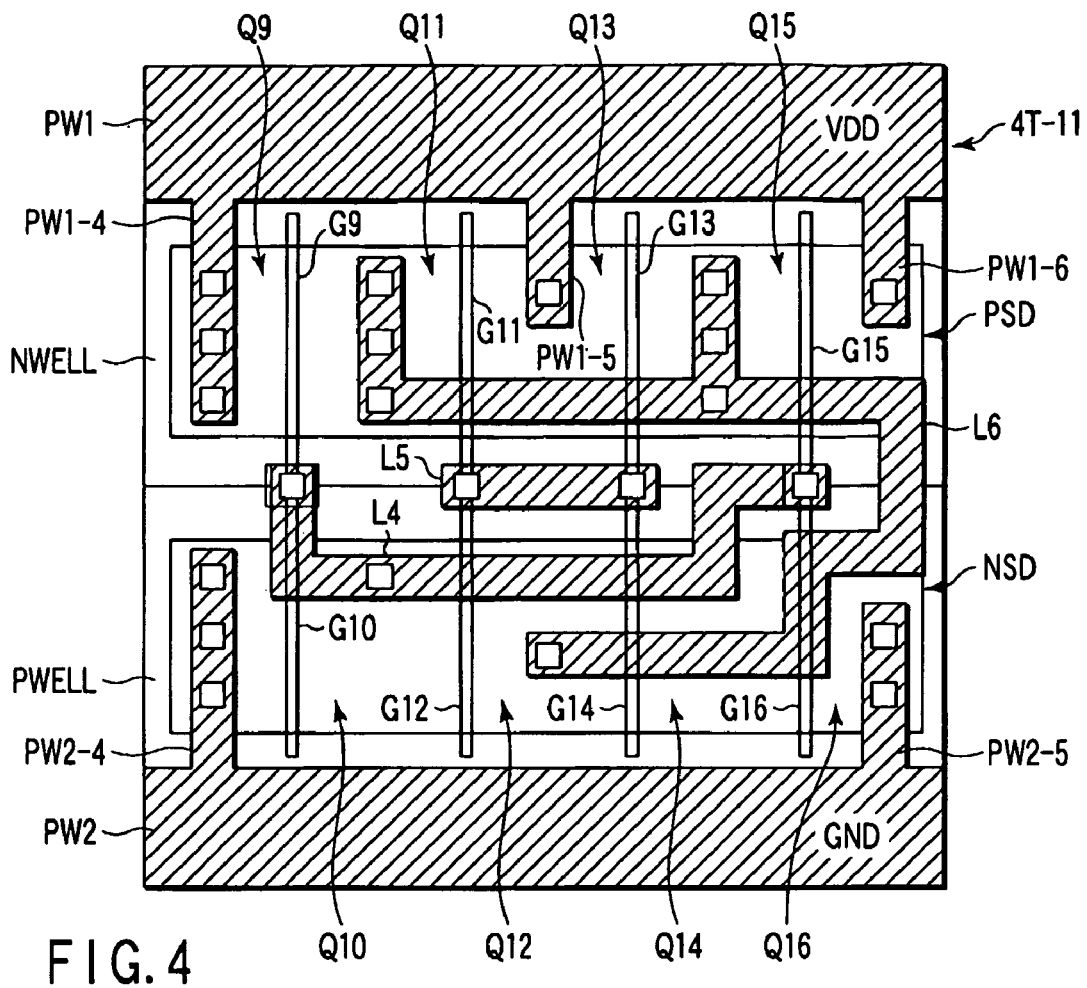
FIG. 4 is a plan view of a pattern layout of a 4-terminal standard cell in the semiconductor integrated circuit device of FIG. 1.
Figure 5:
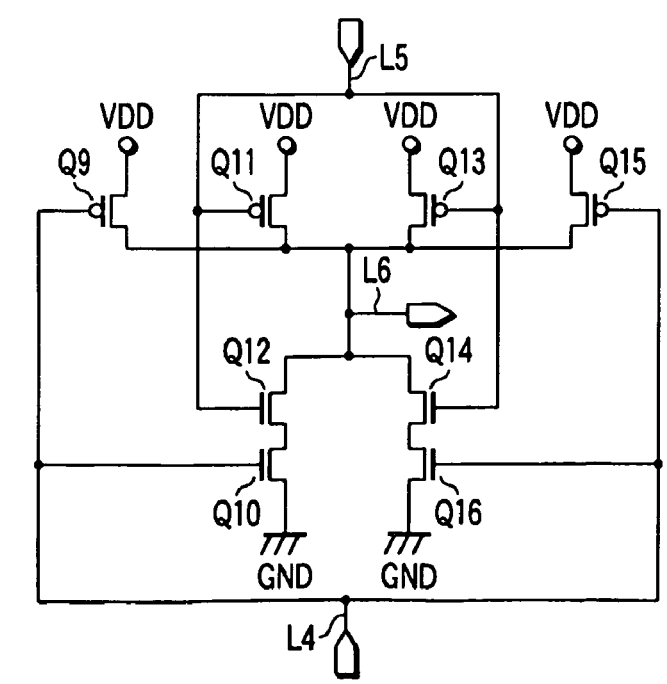
FIG. 5 is a circuit diagram of the standard cell shown in FIG. 4, particularly a CMOS NAND gate.

FIG. 4 shows a pattern layout of a 4-terminal standard cell in the semiconductor integrated circuit device of FIG. 1. FIG. 5 is a circuit diagram of the standard cell shown in FIG. 4, particularly a CMOS NAND gate.

In FIG. 1, four stages of cell columns SC-1 to SC-4 are arranged. The adjacent cell columns SC-1, SC-2 share a power line PW2. The adjacent cell columns SC-2, SC-3 share a power line PW1. The adjacent cell columns SC-3, SC-4 share a power line PW2. The power line PW1 is for, for example, the power supply voltage VDD. The power line PW2 is for, for example, the ground potential GND. Each of the power lines PW1, PW2 has a branched interconnection section (terminal) extending into the cell so as to face the corresponding branched interconnection section of the other as shown in FIGS. 2 and 4. These interconnection sections are connected via contact holes to the semiconductor elements formed in each of the cells, such as the sources or drains of the MOS transistors.

In the cell columns SC1-1 to SC-4, there are provided standard cells 4T-11 to 4T-14, 4T-21 to 4T-24, 4T-31 to 4T-34, 4T-41 to 4T-44, each having no well potential fixing active region, and standard cells 2T-11, 2T-21, 2T-31, 2T-41, each having a well potential fixing active region. Here, a standard cell having no well potential fixing active region is a 4-terminal cell which has a first terminal for power supply voltage VDD, a second terminal for ground (0 V) GND, a third terminal for fixing the potential of the n-well region, and a fourth terminal for fixing the potential of the p-well region. However, between cells of this type, a line for applying the p-well potential fixing potential VBP, a line for applying the n-well potential fixing potential VBN, active regions (N-sub region and P-sub region), and the like are not provided. The source or drain of each MOS transistor formed in the 4-terminal cell is selectively connected to the first and second terminals and its back gate is selectively connected to the third and fourth terminals.

On the other hand, a standard cell with a well potential fixing active region is a 2-terminal cell which has a first terminal for power supply voltage VDD, a second terminal for ground (0 V) GND, and active regions (N-sub region and P-sub region) electrically connected to the first and second terminals respectively. The source or drain of each MOS transistor formed in the 2-terminal cell is selectively connected to the first and second terminals and the well potential fixing active region applies a substrate bias voltage to the back gate of the MOS transistor.

The 2-terminal cells 2T-11, 2T-21, 2T-31, 2T-41 are provided in a region where transistors to be switched simultaneously are concentrated or near a large transistor in the 4-terminal cells 4T-11 to 4T-14, 4T-21 to 4T-24, 4T-31 to 4T-34, 4T-41 to 4T-44, respectively.

These regions include, for example, the vicinity of a flip-flop, the vicinity of such a buffer as a clock buffer, and the vicinity of a circuit where a large number of transistors are connected to a common node.

Then, the 2-terminal cells 2T-11, 2T-21, 2T-31, 2T-41 apply the well potential fixing bias voltage (or the back gate bias of the MOS transistor) to the 4-terminal cells 4T-11 to 4T-14, 4T-21 to 4T-24, 4T-31 to 4T-34, 4T-41 to 4T-44 in the corresponding cell columns respectively, thereby fixing the well potential. At this time, since the 2-terminal cells 2T-11, 2T-21, 2T-31, 2T-41 are provided in a region where transistors to be switched simultaneously are concentrated or near a large transistor, the well potential of the 4-terminal cells is fixed effectively.

As shown in FIG. 2, for example, in the 2-terminal standard cell 2T-11, the power line (metal layer) PW1 for power supply voltage VDD and the power line (metal layer) PW2 for ground potential GND are provided at the upper side and lower side of the cell in the direction in which the cell column extends. In the semiconductor substrate from under the power line PW1 into the cell, an n-well region NWELL is formed, whereas in the semiconductor substrate from under the power line PW2 into the cell, a p-well region PWELL is formed. In the n-well region NWELL, the source-drain region PSD and active region (or N-sub region) NSUB of p-channel MOS transistors Q1, Q3, Q5, Q7 are formed. In the p-well region PWELL, the source-drain region NSD and active region (or P-sub region) PSUB of n-channel MOS transistors Q2, Q4, Q6, Q8 are formed.

The power lines PW1, PW2 have branched interconnection sections (terminals) PW1-1, PW1-2, PW1-3, PW2-1, PW2-2, PW2-3 extending into the cell so as to face the corresponding branched interconnection section. The interconnection section PW1-1 is connected to the active region NSUB and the source of the MOS transistor Q1 via contact holes. The interconnection section PW2-1 is connected to the active region PSUB and the source of the MOS transistor Q2 via contact holes. The interconnection section PW1-2 is connected to the sources of the MOS transistors Q3, Q5 via contact holes. The interconnection section PW1-3 is connected to the source of the MOS transistor Q7 via a contact hole. Similarly, the interconnection section PW2-2 is connected to the sources of the MOS transistors Q4, Q6 via contact holes. The interconnection section PW2-3 is connected to the source of the MOS transistor Q8 via a contact hole.

The gates G1 to G4 of the MOS transistors Q1 to Q4 are arranged in the same direction as the interconnection sections PW1-1 to PW1-3, PW2-1 to PW2-3 and are commonly connected by a line (or a metal layer) L1. The gates G5 to G8 of the MOS transistors Q5 to Q8 are arranged in the same direction as the interconnection sections PW1-1 to PW1-3, PW2-1 to PW2-3 and are commonly connected by a line (or a metal layer) L2 and further connected to the drains of the MOS transistors Q1 to Q4. In addition, the drains of the MOS transistors Q5 to Q8 are commonly connected by a line (or a metal layer) L3. An output signal is obtained from the line L3.

As described above, in a 2-terminal cell with the above configuration, the power line PW1 is connected to the n-well region NWELL via the active region (or N-sub region) NSUB and the power line PW2 is connected to the p-well region PWELL via the active region (or P-sub region) PSUB, thereby fixing the well potential. The active regions PSUB, NSUB are formed in an empty region of the transistor circuit, excluding the parts under the power lines PW1, PW2.

Specifically, in a buffer configured as shown in FIGS. 2 and 3, the MOS transistors Q1 to Q4 constituting the front-stage inverter differ in size from the MOS transistors Q5 to Q8 constituting the back-stage inverter (normally with the ratio of 1:2 to 1:4). Since the size of the front-stage MOS transistors Q1 to Q4 is smaller, an empty region appears in the cell. In the empty region, the active regions PSUB, NSUB are formed.

As shown in FIG. 4, in the 4-terminal standard cell 4T-11, the power line (metal layer) PW1 for power supply voltage VDD and the power line (metal layer) PW2 for ground potential GND are provided at the upper side and lower side of the cell in the direction in which the cell column extends. In the semiconductor substrate under the power line PW1, an n-well region NWELL is formed, whereas in the semiconductor substrate under the power line PW2, a p-well region PWELL is formed. In the n-well region NWELL, the source-drain region PSD of p-channel MOS transistors Q9, Q11, Q13, Q15 are formed. In the p-well region PWELL, the source-drain region NSD of n-channel MOS transistors Q10, Q12, Q14, Q16 are formed.

The power lines PW1, PW2 have branched interconnection sections PW1-4, PW1-5, PW1-6, PW2-4, PW2-5 extending into the cell so as to face the corresponding branched interconnection section. The interconnection section PW1-4 is connected to the source of the MOS transistor Q9 via a contact hole. The interconnection section PW2-4 is connected to the source of the MOS transistor Q10 via a contact hole. The interconnection section PW1-5 is connected to the sources of the MOS transistors Q11, Q13 via contact holes. The interconnection section PW1-6 is connected to the source of the MOS transistor Q15 via a contact hole. Similarly, the interconnection section PW2-5 is connected to the source of the MOS transistor Q16 via a contact hole. The gates G9, G10, G15, G16 of the MOS transistors Q9, Q10, Q15, Q16 are arranged in the same direction as the interconnection sections PW1-4 to PW1-6, PW2-4, PW2-5 and are commonly connected by a line (or a metal layer) L4. The gates G11, G12, G13, G14 of the MOS transistors Q11, Q12, Q13, Q14 are arranged in the same direction as the interconnection sections PW1-4 to PW1-6, PW2-4, PW2-5 and are commonly connected by a line (or a metal layer) L5. In addition, the drains of the MOS transistors Q9, Q11, Q13, Q15 are commonly connected by a line (or a metal layer) L6. An output signal is obtained from the line L6.

The 4-terminal standard cell has neither a P-sub region nor an N-sub region and is not connected to the well potential fixing line. That is, in the cell, the well regions PWELL, NWELL are connected to neither the power supply voltage VDD nor the ground potential GND. In the 4-terminal standard cell, the well regions NWELL, PWELL are connected to the well regions of adjacent 2-terminal cells (or 2-terminal standard cells provided in the same cell column). Then, the well potential fixing bias potential is applied to the well regions NWELL, PWELL. Thus, there is no need to provide an active region at the boundary between cell columns. In addition, neither lines for applying the well potential fixing potential to the active regions nor contact holes are needed. As a result, the cell size can be reduced.

Figure 6:
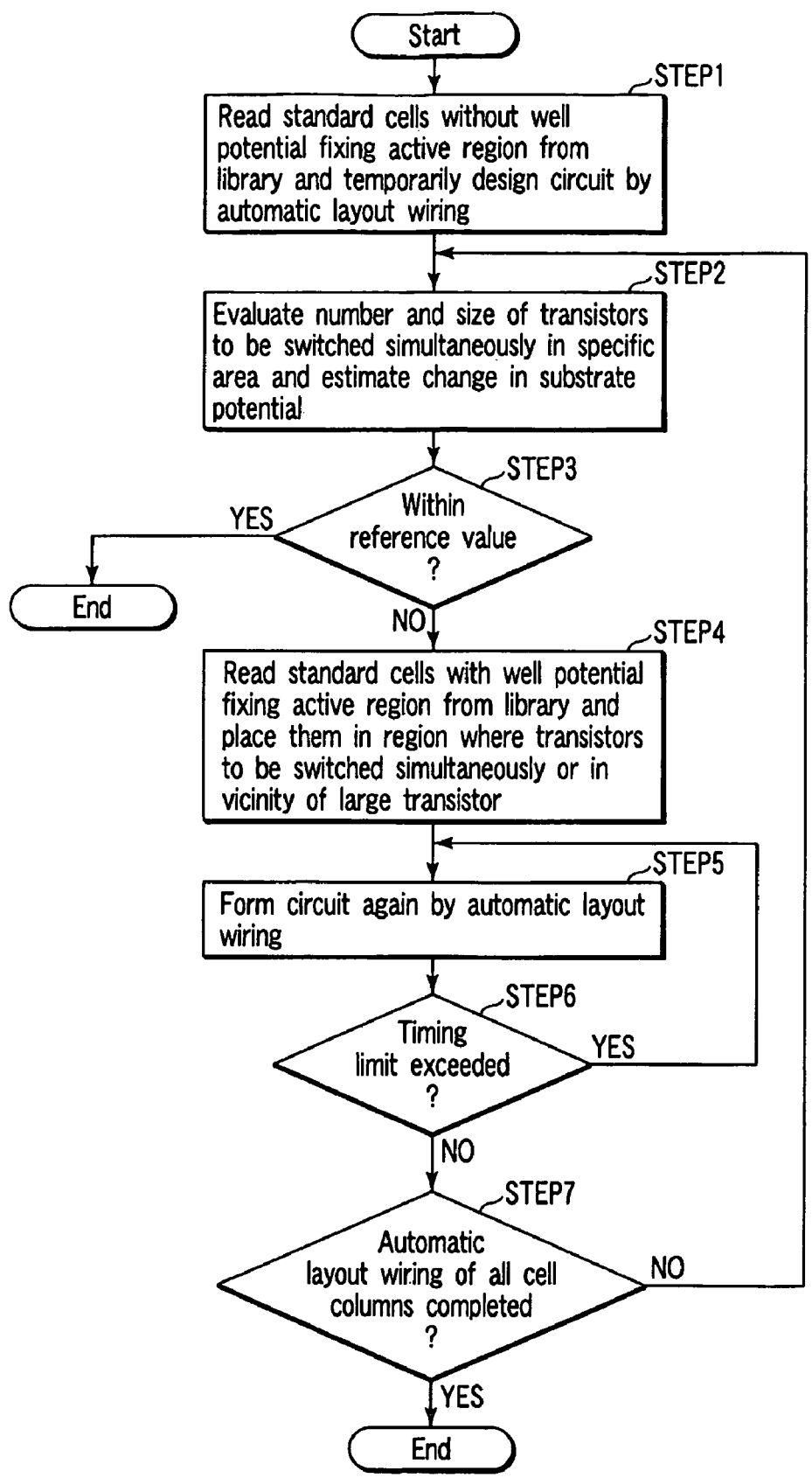
FIG. 6 is a flowchart to help explain a method of designing the semiconductor integrated circuit device of FIG. 1 by automatic layout wiring by use of standard cells shown in FIGS. 2 to 5.

FIG. 6 is a flowchart to help explain a method of designing the semiconductor integrated circuit device of FIG. 1 by automatic layout wiring by use of standard cells shown in FIGS. 2 to 5.

A first group of standard cells composed of various basic circuits without a well potential fixing active region and a second group of standard cells composed of various basic circuits with a well potential fixing active region have been registered in a library.

First, standard cells without a well potential fixing active region are read from the library and automatic layout wiring is done, thereby temporarily designing a circuit (STEP 1).

Next, the number and size of transistors to be switched simultaneously in a specific area in the temporarily designed circuit are evaluated, thereby estimating a change in the substrate potential (STEP 2).

It is determined whether the estimated change in the substrate potential is within a reference value (STEP 3).

When the estimated change in the substrate potential has exceeded the reference value, standard cells with a well potential fixing active region are read from the library and placed in an area where transistors to be switched simultaneously are concentrated or near a large transistor (STEP 4), followed by the formation of a circuit by automatic layout wiring (STEP 5).

Thereafter, the operation timing of the formed circuit is judged. If the judgment has shown that the operation timing has exceeded the timing limit, a circuit is formed again by automatic layout wiring (STEP 6).

Then, the operations in STEP 2 to STEP 6 are repeated until the automatic layout wiring of all the cell columns has been completed (STEP 7).

With the semiconductor integrated circuit device configured as described above and its design method, the well potential fixing bias voltage is selectively applied to a part where the substrate potential may fluctuate because the number and size of transistors to be switched simultaneously are large, which enables the well potential to be fixed. As described above, in the semiconductor integrated circuit device with the lowered power supply voltage, there is almost no possibility that a breakdown will take place due to latch-up. Since the substrate potential has only to be prevented from fluctuating at random, the greater part of the circuit is composed of 4-terminal standard cells and only the necessary part is composed of 2-terminal standard cells. This arrangement enables the 2-terminal standard cells to fix the well potential of the 4-terminal standard cells in the same cell column sufficiently.

Therefore, an increase in the pattern occupied area is suppressed and the well potential can be fixed without permitting the substrate potential to fluctuate. Moreover, the 2-terminal standard cells have active regions located in the empty regions in the cells, not at the boundary between cell columns, which minimizes an increase in the pattern occupied area.

Furthermore, neither an N-sub region nor a P-sub region is formed at the boundary between cell columns. In addition, there is no need to form interconnections for the active regions and make contact with them. Accordingly, the cell width of the 2-terminal standard cell can be narrowed, thereby reducing the pattern occupied area. Moreover, the cell width of the 2-terminal standard cell and that of the 4-terminal standard cell can be made equal to achieve consistency with each other.

Of course, since the sizes of the semiconductor elements formed in the standard cells need not be reduced, a drop in the driving capability can be suppressed.

Therefore, in the semiconductor integrated circuit device with the reduced power supply voltage, it is possible to fix the well potential effectively, while suppressing an increase in the pattern occupied area and a drop in the driving capability of the semiconductor elements formed in the standard cells.

Second Embodiment

In the first embodiment, a change in the substrate current has been estimated and evaluated on the basis of the number and size of the transistors to be switched simultaneously in a specific area. In a second embodiment of the present invention, however, an evaluation is made using a transition probability of the circuit in a cell. Standard cells with an active region are inserted in the vicinity of a standard cell whose transition probability is high.

Figure 7:
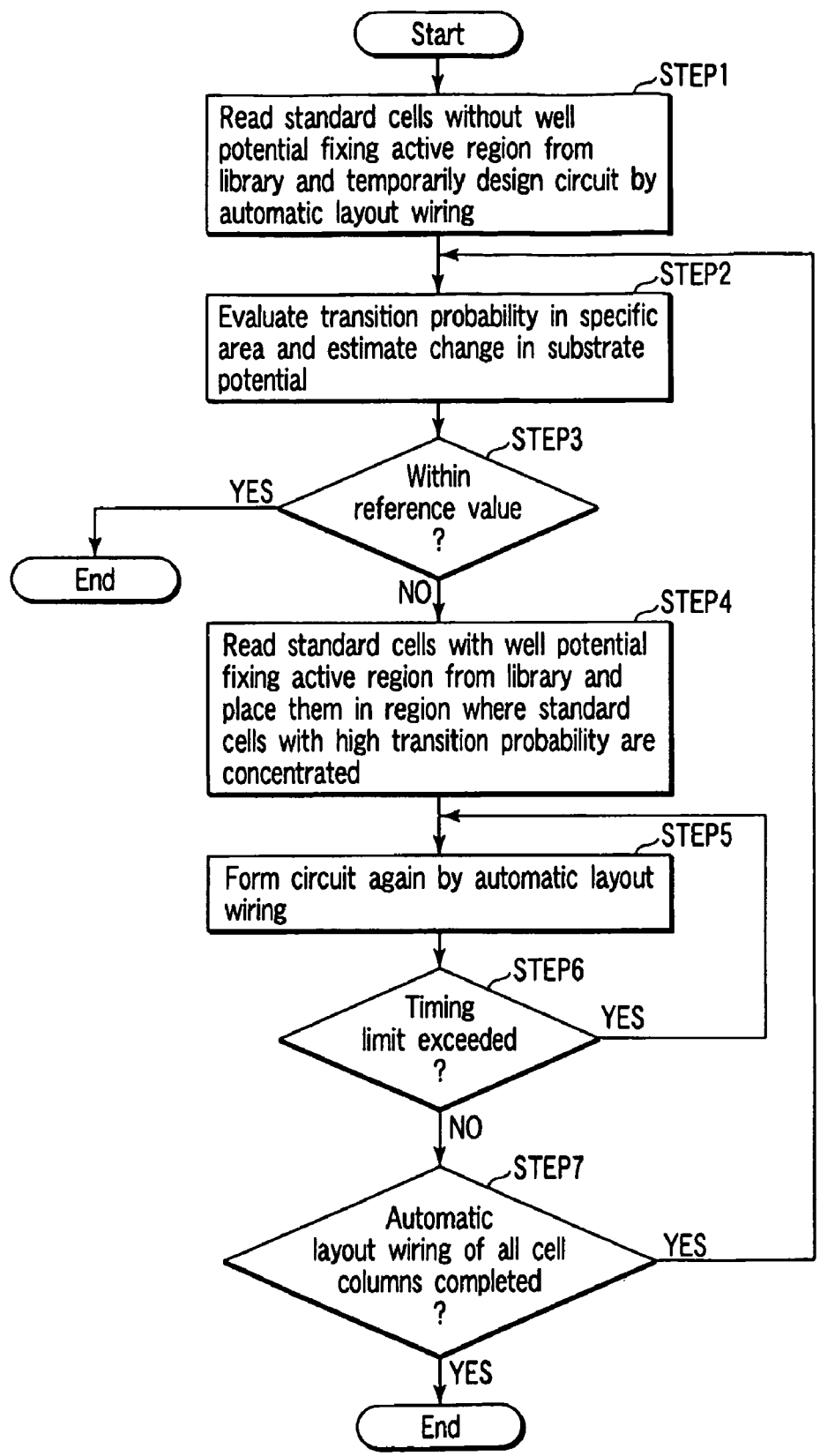
FIG. 7 is a flowchart to help explain a method of designing a semiconductor integrated circuit device according to a second embodiment of the present invention.

As shown in FIG. 7, first, standard cells without a well potential fixing active region are read from a library and automatic layout wiring is done, thereby temporarily designing a circuit (STEP 1).

Next, the transition probability within a specific area in the temporarily designed circuit is evaluated and a change in the substrate potential is estimated (STEP 2).

It is determined whether the estimated change in the substrate potential is within a reference value (STEP 3).

If the estimated change in the substrate potential has exceeded the reference value, standard cells with a well potential fixing active region are read from the library and placed in a region where cells with the highest transition probability are concentrated or in the vicinity of the region (STEP 4), followed by the formation of a circuit by automatic layout wiring (STEP 5).

Thereafter, the operation timing of the formed circuit is judged. If the judgment has shown that the operation timing has exceeded the timing limit, a circuit is formed again by automatic layout wiring (STEP 6).

Then, the operations in STEP 2 to STEP 6 are repeated until the automatic layout wiring of all the cell columns has been completed (STEP 7).

FIG. 8 is a circuit diagram of a typical example of a standard cell whose transition probability is high, particularly a flip-flop in a sequential circuit. The flip-flop is composed of p-channel MOS transistors Q21 to Q38 and n-channel MOS transistors Q39 to Q56. The flip-flop has a terminal to which a power supply VDD is applied, a terminal to which the ground potential GND is applied, a data input terminal T1, a scan data input terminal T2, a clock input terminal T3, a scan select signal input terminal T4, and an output terminal T5.

An external clock signal EXCLK inputted to the clock input terminal T3 is input to a CMOS inverter INV1 composed of MOS transistors Q35 and Q53, thereby generating an internal clock signal /CLK. The internal clock signal /CLK output from the CMOS inverter INV1 is supplied to a CMOS inverter INV2 composed of MOS transistors Q36 and Q54, which inverts the clock signal to produce an internal clock signal CLK.

An external scan select signal EXSCSEL input to the scan select signal input terminal T4 is input to a CMOS inverter INV3 composed of MOS transistors Q37 and Q55, thereby generating an internal scan select signal/SCSEL. The internal scan select signal /SCSEL outputted from the CMOS inverter INV3 is supplied to a CMOS inverter INV4 composed of MOS transistors Q38 and Q56, which inverts the signal to produce an internal scan select signal SCSEL.

The current paths of the MOS transistors Q21, Q22, Q39, Q40 are connected in series between the power supply VDD and the ground point GND. The gates of the MOS transistors Q21, Q40 are connected to the input terminal T1 to which data DA is supplied. The scan select signal SCSEL output from the inverter INV4 is supplied to the gate of the MOS transistor Q22. The scan select signal /SCSEL output from the inverter INV3 is supplied to the gate of the MOS transistor Q39.

Similarly, the current paths of the MOS transistors Q23, Q24, Q41, Q42 are connected in series between the power supply VDD and the ground point GND. The gates of the MOS transistors Q23, Q42 are connected to the input terminal T2 to which scan data SCDA is supplied. The scan select signal /SCSEL output from the inverter INV3 is supplied to the gate of the MOS transistor Q24. The scan select signal SCSEL output from the inverter INV4 is supplied to the gate of the MOS transistor Q41.

One end of a transfer gate TGE is connected to the junction point of the MOS transistors Q22, Q39 and the junction point of the MOS transistors Q24, Q41. The transfer gate TGE is composed of MOS transistors Q25, Q43 whose current paths are connected in parallel. The clock signal CLK output from the inverter INV2 is supplied to the gate of the MOS transistor Q25. The clock signal /CLK output from the inverter INV1 is supplied to the gate of the MOS transistor Q43.

The input terminal of a CMOS inverter INV5 composed of MOS transistors Q26 and Q44 and the junction point of the current paths of MOS transistors Q28, Q45 are connected to the other end of the transfer gate TGE. The current paths of MOS transistors Q27, Q28, Q45, Q46 are connected in series between the power supply VDD and the ground point GND. The output terminal of the inverter INV5 is connected to the gates of the MOS transistors Q27, Q46. The clock signal /CLK output from the inverter INV1 is supplied to the gate of the MOS transistor Q28. The clock signal CLK output from the inverter INV2 is supplied to the gate of the MOS transistor Q47.

Furthermore, the gates of the MOS transistors Q29, Q48 are connected to the other end of the transfer gate TGE. The current paths of MOS transistors Q29, Q30, Q47, Q48 are connected in series between the power supply VDD and the ground point GND. The clock signal /CLK output from the inverter INV1 is supplied to the gate of the MOS transistor Q30. The clock signal CLK output from the inverter INV2 is supplied to the gate of the MOS transistor Q47.

The input terminal of a CMOS inverter INV6 composed of MOS transistors Q31 and Q49 and the junction point of the current paths of MOS transistors Q33, Q50 are connected to the junction point of the current paths of the MOS transistors Q30, Q47. The current paths of MOS transistors Q32, Q33, Q50, Q51 are connected in series between the power supply VDD and the ground point GND. The output terminal of the inverter INV6 is connected to the gates of the MOS transistors Q32, Q51. The inverter INV2 supplies the clock signal CLK to the gate of the MOS transistor Q33. The inverter INV1 supplies the clock signal /CLK to the gate of the MOS transistor Q50.

Furthermore, the input terminal of a CMOS inverter INV7 composed of MOS transistors Q34 and Q52 is connected to the output terminal of the inverter INV6. The output of the inverter INV7 is connected to an output terminal T5.

Since a standard cell with such a flip-flop has a high circuit transition probability and therefore becomes a noise source, a standard cell as shown in, for example, FIGS. 2 and 3 is provided next to the standard cell, thereby not only stabilizing the circuit operation by fixing the well potential but also reducing noise.

Therefore, according to the above configuration and the manufacturing method, in the semiconductor integrated circuit device with the lowered power supply voltage, it is possible to fix the well potential effectively, while suppressing an increase in the pattern occupied area and a drop in the driving capability of the semiconductor elements formed in the standard cells.

Third Embodiment

In the second embodiment, evaluation has been made using a circuit transition probability and a standard cell with an active region has been inserted in the vicinity of a standard cell whose transition probability is high. In a third embodiment of the present invention, however, evaluation is made using a cell appearance probability and a standard cell with an active region is inserted in the vicinity of a standard cell whose appearance probability is high.

Figure 9:
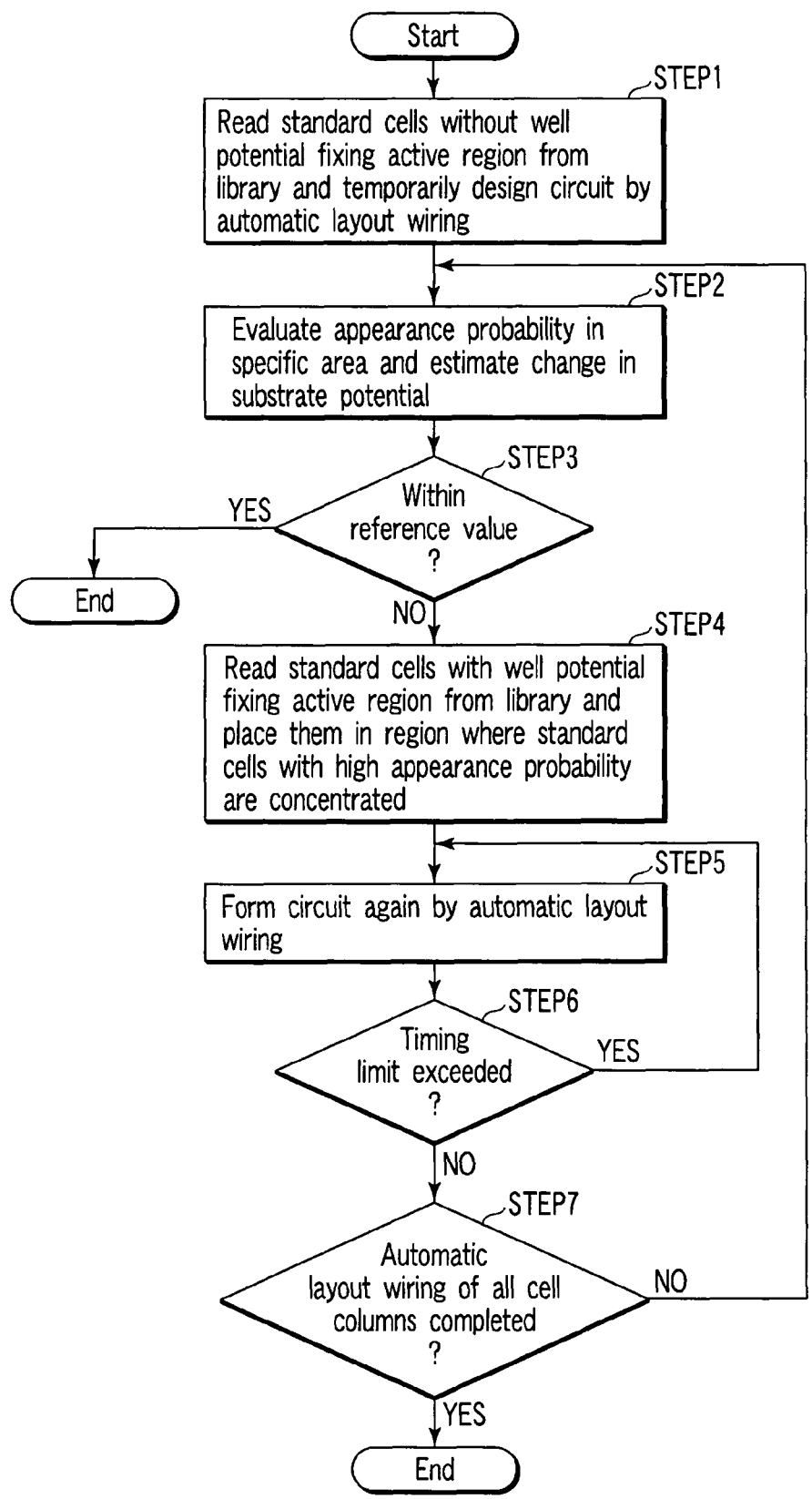
FIG. 9 is a flowchart to help explain a method of designing a semiconductor integrated circuit device according to a third embodiment of the present invention.

Specifically, as shown in FIG. 9, first, standard cells without a well potential fixing active region are read from a library and automatic layout wiring is done, thereby temporarily designing a circuit (STEP 1).

Next, the appearance probability within a specific area in the temporarily designed circuit is evaluated and a change in the substrate potential is estimated (STEP 2).

It is determined whether the estimated change in the substrate potential is within a reference value (STEP 3).

If the estimated change in the substrate potential has exceeded the reference value, standard cells with a well potential fixing active region are read from the library and placed in a region where cells with the highest appearance probability are concentrated or in the vicinity of the region (STEP 4), followed by the formation of a circuit by automatic layout wiring (STEP 5).

Thereafter, the operation timing of the formed circuit is judged. If the judgment has shown that the operation timing has exceeded the timing limit, a circuit is formed again by automatic layout wiring (STEP 6).

Then, the operations in STEP 2 to STEP 6 are repeated until the automatic layout wiring of all the cell columns has been completed (STEP 7).

As described above, a standard cell with a well potential fixing active region is provided in the vicinity of a standard cell whose appearance probability is high, thereby fixing the well potential, which enables the main circuit section to operate stably.

[Modification 1]

In the first to third embodiments, standard cells without a well potential fixing active region have been first read from the library and a circuit has been temporarily designed by automatic layout wiring. However, as for a standard cell whose well potential has to be fixed, such as a large-sized clock buffer, the cell may be registered in a library in advance and, at the first temporary design stage, it may be read from the library to temporarily design a circuit.

[Modification 2]

In the first to third embodiments and the first modification, a well potential fixing standard cell has been inserted next to a region where the well potential had to be fixed. However, the standard cell whose well potential has been assumed to have to be fixed may be replaced with a standard cell with a well potential fixing active region. Specifically, for example, in a flip-flop with the configuration as shown in FIG. 8, it is common practice that the transistors in the part called a holder, composed of an inverter INV5 and MOS transistors Q27, Q28, Q45, Q46 and MOS transistors Q32, Q33, Q50, Q51, are designed to be smaller than those in the other parts. Accordingly, a region for transistors smaller in size than those in the other parts appears. Forming active regions NSUB, PSUB in the empty region caused by the smaller transistors enables the active regions NSUB, PSUB to be formed in the cell without increasing the pattern occupied area.

The sequential circuit is often provided with a test scan circuit composed of MOS transistors Q23, Q24, Q41, Q42. The test scan circuit may be composed of smaller transistors than those in the other parts. Therefore, in the empty region adjacent to these transistors, active regions NSUB, PSUB may be formed.

As described above, when active regions NSUB, PSUB are formed in the sequential circuit, active regions NSUB, PSUB are formed in the empty region and are selectively provided near the necessary region, which minimizes an increase in the pattern occupied area.

Since standard cells with a well potential fixing active area might be limited in transistor size, the cells with less severe timing restriction should be replaced with cells with a well potential fixing active region after temporary arrangement.

[Application]

Next, a drawing apparatus will be explained as an application of the semiconductor integrated circuit device according to the first and third embodiments and its design method.

FIG. 10 is a block diagram of an image drawing processor system LSI. The image drawing processor system LSI 10 includes a host processor 20, an I/O processor 30, a main memory 40, and a graphic processor 50. The host processor 20 and the graphic processor 50 are connected to each other by a processor bus BUS in such a manner that they can communicated with each other.

The host processor 20 includes a main processor 21, I/O sections 22 to 24, and a plurality of signal processing sections comprising digital signal processors (DSPs) 25. These circuit blocks are connected to one another via a local network LN1 in such a manner that they can communicate with one another. The main processor 21 controls each circuit block in the host processor 20. The I/O section 22 exchanges data with a circuit outside the host processor 20 via the I/O processor 30. The I/O section 23 exchanges data with the main memory 40. The I/O section 24 exchanges data with the graphic processor 50 via the processor bus BUS. The signal processing section 25 processes signals on the basis of the data read from the main memory 40 or from the outside world.

The I/O processor 30 connects the host processor 20 to, for example, a general-purpose bus, peripheral devices, including a HDD and a digital versatile disk (DVD) drive, and a network. At this time, the peripheral device may be mounted on the LSI 10 or provided outside the LSI 10.

The main memory 40 holds a program necessary for the host processor 20 to operate. The program is read from, for example, an HDD (not shown) or the like and is stored in the main memory 40.

The graphic processor 50 includes a controller 51, I/O sections 52, 53, and a computing section 54. The controller 51 communicates with the host processor 20 and controls the computing section 54. The I/O section 52 supervises the input and output to and from the host processor 20 via the processor bus BUS. The I/O section 53 supervises the input and output to and from various general-purpose buses, including a PCI bus, video and audio equipment, and an external memory or the like. The computing section 54 does image processing calculations.

The computing section 54 includes a rasterizer 55 and a plurality of signal processing sections 56-0 to 56-31. Although the number of signal processing sections 56 is 32, it is illustrative and not restrictive and may be 8, 16, or 64.

Figure 11:
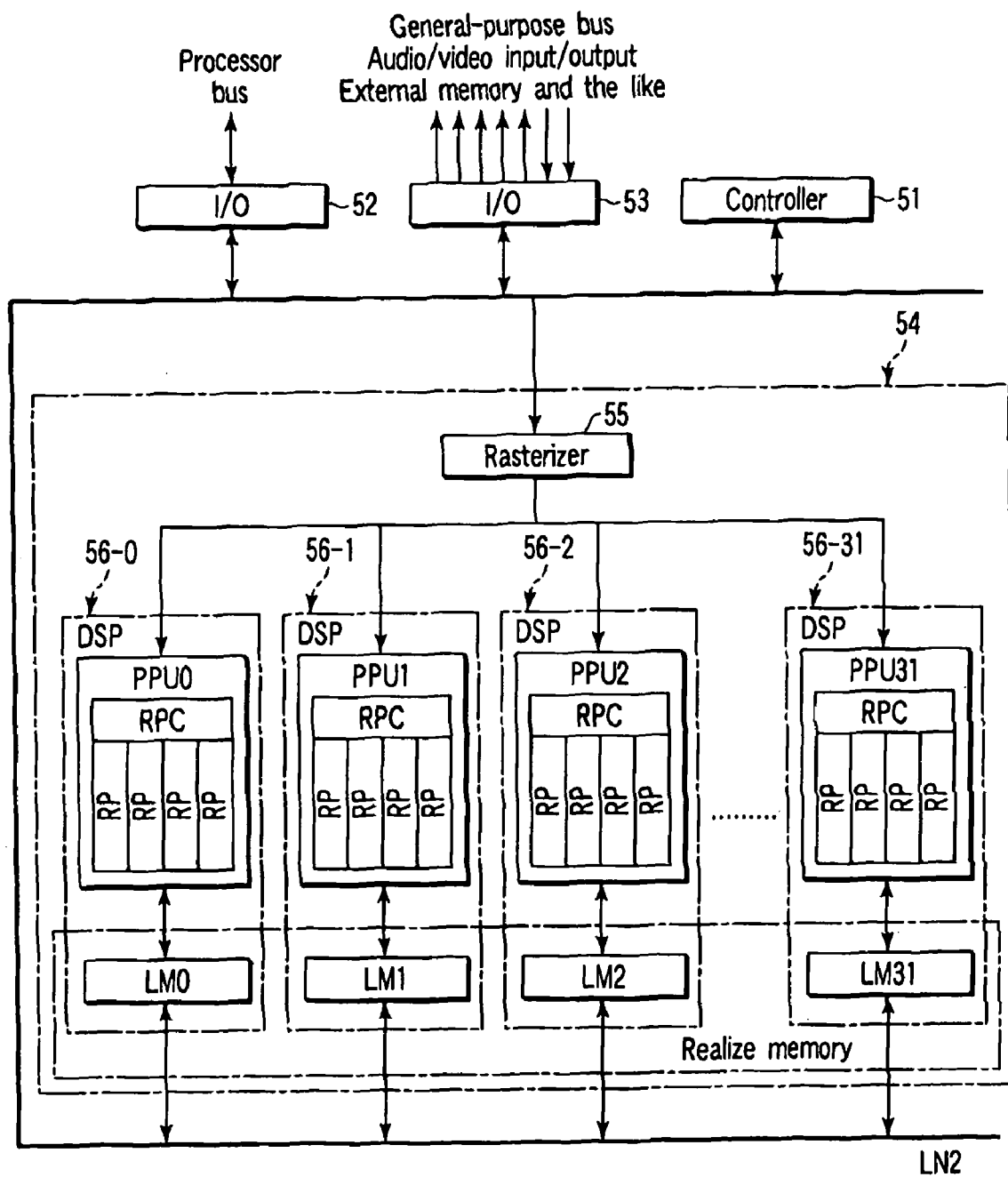
FIG. 11 is a block diagram to help explain a detailed configuration of the graphic processor in the circuit of FIG. 10.

A detailed configuration of the graphic processor 50 in the circuit of FIG. 10 will be explained by reference to FIG. 11. The computing section 54 includes the rasterizer 55 and 32 signal processing sections 56-0 to 56-31. The rasterizer 55 generates pixels according to the input image information. A pixel is the smallest unit area handled in drawing a specific figure. A figure is represented by a set of pixels. The generated pixels are determined by the shape of a figure (the positions occupied by a figure). That is, when a certain position is drawn, a pixel corresponding to the position is generated. When another position is drawn, another pixel corresponding to the position is generated. The signal processing sections 56-0 to 56-31 include pixel processing sections PPU0 to PPU31 and local memories LM0 to LM31, respectively. The local memories LM0 to LM31 are provided for the pixel processing sections PPU0 to PPU31 in a one-to-one correspondence.

Each of the pixel processing sections PPU0 to PPU31 has four realization pipes RP. Four realization pipes RP constitute one RP cluster RPC (realization pipe cluster). Each of the PR clusters PRC performs a single instruction multiple data (SIMD) operation, thereby processing four pixels at the same time. The pixels corresponding to the respective positions of the figure are allocated to the pixel processing sections PPU0 to PPU31. According to the positions occupied by the figure, the corresponding pixel processing sections PPU0 to PPU31 process the pixels.

The local memories LM0 to LM31 store the pixel data generated by the pixel processing sections PPU0 to PPU31, respectively. The local memories LM0 to MM31 constitute a realization memory as a whole. The realization memory is, for example, a DRAM. In the DRAM, the individual memory areas having a specific data width correspond to the local memories LM0 to LM31.

In the image drawing processor system LSI configured as described above, when the method of designing a semiconductor integrated circuit device according to the first to third embodiments is applied to the analog circuits, SRAM, and logic circuit, excluding the memories, such as the main processor 21, controller 51, or rasterizer 55, the pattern occupied area of these circuit sections can be reduced, which realizes higher integration.

Therefore, according to the first to third embodiments, instead of applying the well potential fixing potential to all of the standard cells (or each of the standard cells), the well potentials near or of the necessary cells are fixed. Accordingly, the area of the standard cells can be reduced or the transistors in a standard cell can be made larger to increase the driving capability, which enables higher integration or higher performance of the semiconductor integrated circuit device.

As described above, a semiconductor integrated circuit device with the reduced power supplied voltage and related design method are realized which are capable of fixing the well potential effectively, while suppressing an increase in the pattern occupied area and a drop in the driving capability of the semiconductor elements formed inside.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A semiconductor integrated circuit device comprising:
a circuit section which is formed by arranging a set of cell columns, each cell column having a plurality of standard cells arranged in a first direction,
each of the set of cell columns including:
a first set of the plurality of standard cells, each of the first set of the plurality of standard cells including:
a first terminal and a second terminal to which a power supply voltage and a ground potential are applied, and
a first circuit which includes a first transistor that operates on a voltage applied between the first terminal and the second terminal wherein the first circuit has no well potential fixing active region, and
a second set of the plurality of standard cells arranged in a region in which a set of transistors in the first set of the plurality of standard cells that are to be switched according to the same timing are concentrated, or near a large transistor, wherein each of the second set of the plurality of standard cells includes:
a third terminal and a fourth terminal to which the power supply voltage and the ground potential are applied, and
a second circuit which includes a first active region and a second active region for fixing a well potential formed in an empty region inside the cell, wherein the first active region is electronically connected to the third terminal and the second active region is electrically connected to the fourth terminal and
a second transistor to which power is supplied from the third terminal and fourth terminal and a back gate bias is applied from the first active region and second active region,
wherein a well potential of the first set of the plurality of standard cells in the cell columns is configured to be fixed by the second set of the plurality of standard cells.

2. The semiconductor integrated circuit device according to claim 1, wherein the second circuit operates in response to a clock signal.

3. The semiconductor integrated circuit device according to claim 2, wherein the second circuit is a flip-flop or buffer, and
the empty region in the second set of the plurality of standard cells is adjacent to a small transistor in the flip-flop or buffer.

4. The semiconductor integrated circuit device according to claim 1, wherein:
each of the first set of the plurality of standard cells includes:
a first power line and a second power line acting as the first terminal and second terminal, wherein the first power line and second power line are provided on two facing sides of the cell and extend in the first direction,
a first well region of a first conductivity type formed in a semiconductor substrate, and
a second well region of a second conductivity type formed next to the first well region in the semiconductor substrate, and
each of the second standard cells includes:
a third power line and a fourth power line acting as the third terminal and fourth terminal, wherein the third power line and fourth power line are provided on two facing sides of the cell and extend in the first direction,
a third well region of the first conductivity type formed in the semiconductor substrate, and
a fourth well region of the second conductivity type formed next to the third well region in the semiconductor substrate,
wherein the first active region is formed in the third well region and contacts a fifth terminal formed by branching the third power line in a second direction substantially perpendicular to the first direction, and
the second active region is formed in the fourth well region and contacts a sixth terminal formed by branching the fourth power line in the second direction.

5. The semiconductor integrated circuit device according to claim 4, wherein the first power line and third power line in the cell columns are commonly connected, the second power line and fourth power line in the cell columns are commonly connected, the first well region and third well region in each cell column are commonly connected, and the second well region and fourth well region in each cell column are commonly connected,
the first set of the plurality of standard cells and the second set of the plurality of standard cells in each cell column share the first power line and second power line, and
adjacent cell columns share either the commonly connected first power line and third power line or the commonly connected second power line and fourth power line.

6. A semiconductor integrated circuit device comprising:
a circuit section which is formed by arranging cell columns, each cell column having standard cells arranged in a first direction, each cell column including:
a first set of standard cells each comprising
 a first terminal and a second terminal to which a power supply voltage and a ground potential are applied, and
 a first circuit which includes a switch element that operates on a voltage applied between the first terminal and the second terminal, wherein the first circuit has no well potential fixing active region, and
a second set of standard cells which are arranged in the vicinity of a region where the transition probability is high in the first set of standard cells, wherein each of the second set of standard cells includes:
 a third terminal and a fourth terminal to which the power supply voltage and the ground potential are applied, and
 a second circuit which includes a first active region and a second active region for fixing a well potential formed in an empty region inside the cell, wherein the first active region is electronically connected to the third terminal and the second active region is electrically connected to the fourth terminal and a transistor to which power is supplied from the third terminal and fourth terminal and a back gate bias is applied from the first active region and second active region, wherein a well potential of the first set of standard cells in the cell columns is configured to be fixed by the second set of standard cells.

7. The semiconductor integrated circuit device according to claim 6, wherein the second circuit operates in response to a clock signal.

8. The semiconductor integrated circuit device according to claim 7, wherein the second circuit is a flip-flop or buffer, and
the empty region in the second set of standard cells is adjacent to a small transistor in the flip-flop or buffer.

9. The semiconductor integrated circuit device according to claim 6, wherein
each of the first set of standard cells includes:
 a first power line and a second power line acting as the first terminal and second terminal, wherein the first power line and second power line are provided on two facing sides of the cell and extend in the first direction,
 a first well region of a first conductivity type formed in a semiconductor substrate, and
 a second well region of a second conductivity type formed next to the first well region in the semiconductor substrate, and
each of the second set of standard cells includes:
 a third power line and a fourth power line acting as the third terminal and fourth terminal, wherein the third power line and fourth power line are provided on two facing sides of the cell and extend in the first direction,
 a third well region of the first conductivity type formed in the semiconductor substrate, and
 a fourth well region of the second conductivity type formed next to the third well region in the semiconductor substrate,
 wherein the first active region is formed in the third well region and contacts a fifth terminal formed by branching the third power line in a second direction substantially perpendicular to the first direction, and
 the second active region is formed in the fourth well region and contacts a sixth terminal formed by branching the fourth power line in the second direction.

10. The semiconductor integrated circuit device according to claim 9,
wherein the first power line and third power line in the cell columns are commonly connected, the second power line and fourth power line in the cell columns are commonly connected, the first well region and third well regions in each cell columns are commonly connected, and the second well region and fourth well regions in each cell columns are commonly connected,
the first set of the plurality of standard cells and the second set of the plurality of standard cells in each cell column share the first power line and second power line, and
adjacent cell columns share either the commonly connected first power line and third power line or the commonly connected second power line and fourth power line.

11. A semiconductor integrated circuit device comprising:
a circuit section which is formed by arranging cell columns, each having standard cells arranged in a first direction,
each cell column including:
 a first set of standard cells each comprising:
  a first terminal and a second terminal to which a power supply voltage and a ground potential are applied, and
  a first circuit which operates on a voltage applied between the first terminal and the second terminal, wherein the first circuit has no well potential fixing active region, and
 a second set of standard cells which are arranged in the vicinity of a region where first standard cell with a high transition probability are concentrated, wherein each of the second set of standard cells includes:
  a third terminal and a fourth terminal to which the power supply voltage and the ground potential are applied, and
  a second circuit which includes a first active region and a second active region for fixing a well potential formed in an empty region inside the cell, wherein the first active region is electronically connected to the third terminal and the second active region is electrically connected to the fourth terminal and a transistor to which power is supplied from the third terminal and fourth terminal and a back gate bias is applied from the first active region and second active region, wherein a well potential of the first set of standard cells in the cell columns is configured to be fixed by the second set of standard cells.

12. The semiconductor integrated circuit device according to claim 11, wherein the second circuit operates in response to a clock signal.

13. The semiconductor integrated circuit device according to claim 12, wherein the second circuit is a flip-flop or buffer, and
the empty region in the second set of standard cells is adjacent to a small transistor in the flip-flop or buffer.

14. The semiconductor integrated circuit device according to claim 11, wherein each of the first set of standard cells includes:
 a first power line and a second power line acting as the first terminal and second terminal, wherein the first power line and second power line are provided on two facing sides of the cell and extend in the first direction,
 a first well region of a first conductivity type formed in a semiconductor substrate, and
 a second well region of a second conductivity type formed next to the first well region in the semiconductor substrate, and each of the second set of standard cells includes:
- a third power line and a fourth power line acting as the third terminal and fourth terminal, wherein the third power line and fourth power line are provided on two facing sides of the cell and extend in the first direction,
- a third well region of the first conductivity type formed in the semiconductor substrate, and
- a fourth well region of the second conductivity type formed next to the third well region in the semiconductor substrate,
- wherein the first active region is formed in the third well region and contacts a fifth terminal formed by branching the third power line in a second direction substantially perpendicular to the first direction, and
- the second active region is formed in the fourth well region and contacts a sixth terminal formed by branching the fourth power line in the second direction.

15. The semiconductor integrated circuit device according to claim 14,
- wherein the first power line and third power line in the cell columns are commonly connected, the second power line and fourth power line in the cell columns are commonly connected, the first well region and third well region in each cell columns are commonly connected, and the second well region and fourth well region in each cell column are commonly connected,
- the first set of the plurality of standard cells and the second set of the plurality of standard cells in each cell column share the first power line and second power line, and
- adjacent cell columns share either the commonly connected first power line and third power line or the commonly connected second power line and fourth power line.

16. A semiconductor integrated circuit device designing method embodied on a non-transitory computer readable medium, the method comprising:
- reading a first group of standard cells without a well potential fixing active region from a library and temporarily designing a circuit by automatic layout wiring;
- estimating a change in a substrate potential from at least one of a number of transistors to be switched according to the same timing in the temporarily designed circuit, a size of the number of transistors to be switched according to the same timing, a transition probability, and an appearance probability;
- determining whether the estimated change in the substrate potential is within a reference value; and
- reading a second group of standard cells with a well potential fixing active region from the library, placing the second group of standard cells in a region where the estimated change in the substrate potential in the first group of standard cells exceeds the reference value, and forming the circuit by automatic layout wiring.

17. The semiconductor integrated circuit device designing method according to claim 16, wherein the act of temporarily designing the circuit by automatic layout wiring further includes reading the second group of standard cells with the well potential fixing active region from the library.

18. The semiconductor integrated circuit device designing method according to claim 17, wherein a first standard cell in the second group of standard cells has a large change in the substrate potential which is registered in the library before the circuit is temporarily designed.

19. The semiconductor integrated circuit device designing method according to claim 16, wherein forming the circuit by automatic layout wiring comprises replacing the standard cells in the temporarily designed circuit using the first group of standard cells with the second group of standard cells.

20. The semiconductor integrated circuit device designing method according to claim 16, wherein forming the circuit by automatic layout wiring comprises inserting the second group of standard cells into a cell column where the first group of standard cells in the temporarily designed circuit are arranged.

* * * * *